(12) United States Patent
Ptakova et al.

(10) Patent No.: US 12,002,722 B2
(45) Date of Patent: Jun. 4, 2024

(54) POWER SEMICONDUCTOR DEVICE

(71) Applicant: Hitachi Energy Ltd, Zürich (CH)

(72) Inventors: Zuzana Ptakova, Prague (CZ); Michal Tilser, Zlín (CZ)

(73) Assignee: Hitachi Energy Ltd, Zürich (CH)

( * ) Notice: Subject to any disclaimer, the term of this patent is extended or adjusted under 35 U.S.C. 154(b) by 335 days.

(21) Appl. No.: 17/631,589

(22) PCT Filed: Jul. 29, 2020

(86) PCT No.: PCT/EP2020/071387
§ 371 (c)(1),
(2) Date: Jan. 31, 2022

(87) PCT Pub. No.: WO2021/018957
PCT Pub. Date: Feb. 4, 2021

(65) Prior Publication Data
US 2022/0336300 A1 Oct. 20, 2022

(30) Foreign Application Priority Data

Jul. 31, 2019 (EP) ..................................... 19189286

(51) Int. Cl.
*H01L 23/051* (2006.01)
*H01L 23/58* (2006.01)
(Continued)

(52) U.S. Cl.
CPC .......... *H01L 23/051* (2013.01); *H01L 23/585* (2013.01); *H01L 23/62* (2013.01); *H01L 25/165* (2013.01)

(58) Field of Classification Search
CPC ..... H01L 23/051; H01L 23/585; H01L 23/62; H01L 25/165
See application file for complete search history.

(56) References Cited

U.S. PATENT DOCUMENTS 4,150,394 A * 4/1979 Sugawa ................ H01L 23/051
257/785
4,274,106 A 6/1981 Ohdate
(Continued)

FOREIGN PATENT DOCUMENTS

CN 107924882 A 4/2018
DE 3032133 A1 3/1981
(Continued)

*Primary Examiner* — Peniel M Gumedzoe
(74) *Attorney, Agent, or Firm* — Slater Matsil, LLP

(57) ABSTRACT

A power semiconductor device includes first and second disc-shaped electrodes and a wafer sandwiched between the electrodes. An outer insulating ring is attached to the first and second electrodes and surrounds the wafer. An inner insulating ring is located inside of the outer insulating ring and surrounds the wafer and a ring-shaped first flange portion laterally surrounds a main portion of the first electrode. An O-ring radially surrounds the main portion of the first electrode and is sandwiched in a vertical direction between the inner insulating ring and the first flange portion. In a relaxed state the O-ring has a cross-section that is elongated in the vertical direction such that, in the relaxed state, a height of the O-ring in the vertical direction is greater than a width of the O-ring in a radial direction that is parallel to the first contact face.

20 Claims, 10 Drawing Sheets

(51) Int. Cl.
    *H01L 23/62*     (2006.01)
    *H01L 25/16*     (2023.01)

(56) References Cited

U.S. PATENT DOCUMENTS

| | | |
|---|---|---|
| 4,399,452 A | 8/1983 | Nakashima et al. |
| 4,775,916 A | 10/1988 | Kouzuchi et al. |
| 2006/0038268 A1* | 2/2006 | Scholz ............... H01L 23/051 257/730 |
| 2008/0073767 A1 | 3/2008 | Taguchi et al. |
| 2016/0079134 A1 | 3/2016 | Miyake et al. |
| 2018/0090401 A1 | 3/2018 | Mohn et al. |

FOREIGN PATENT DOCUMENTS

| | | |
|---|---|---|
| DE | 8909244 U1 | 9/1989 |
| DE | 3941041 A1 | 2/1991 |
| DE | 10306767 A1 | 8/2004 |
| EP | 0415059 A2 | 3/1991 |
| EP | 1906443 A2 | 4/2008 |
| EP | 1906443 A3 | 12/2008 |
| EP | 3007220 A1 | 4/2016 |
| EP | 3073530 A1 | 9/2016 |
| JP | S54161272 A | 12/1979 |
| JP | H112326 A | 1/1999 |
| JP | 2008084926 A | 4/2008 |
| JP | 2016062983 A | 4/2016 |
| JP | 2018518051 A | 7/2018 |
| WO | 2016184590 A1 | 11/2016 |

\* cited by examiner

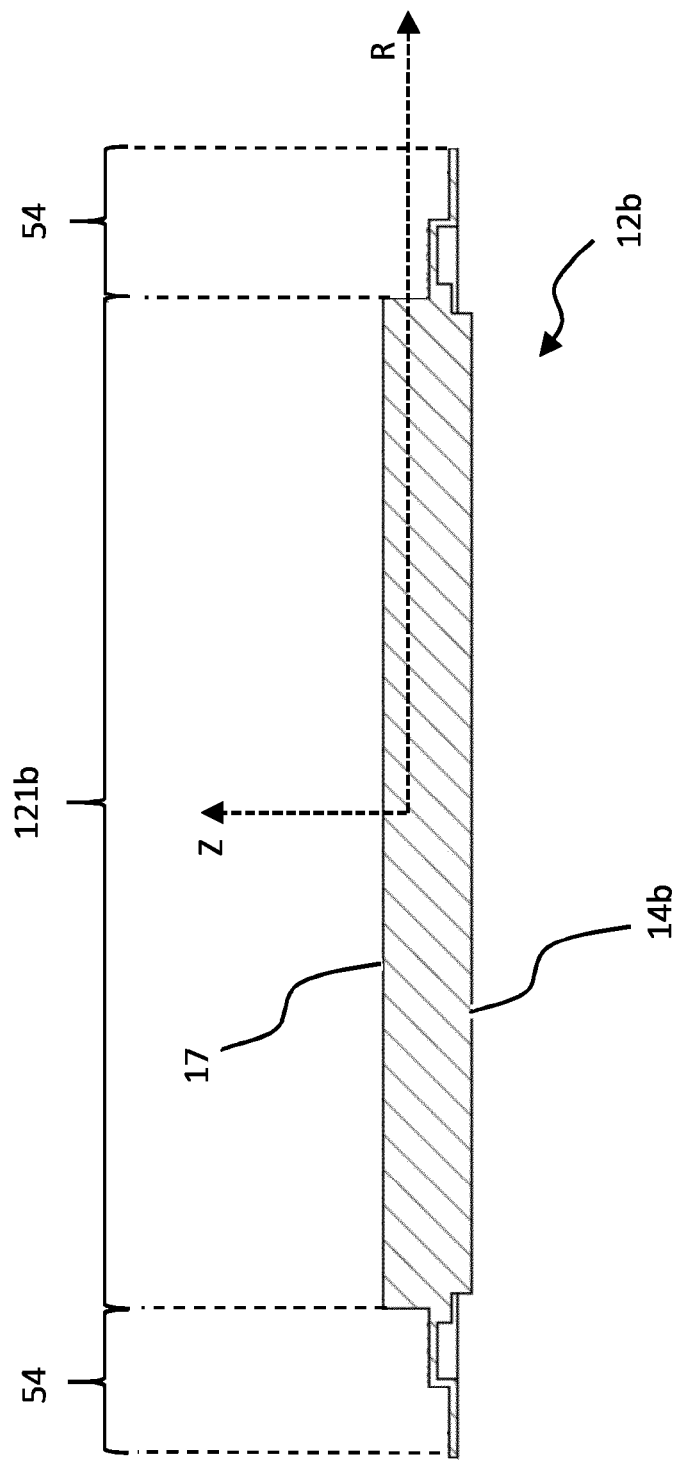

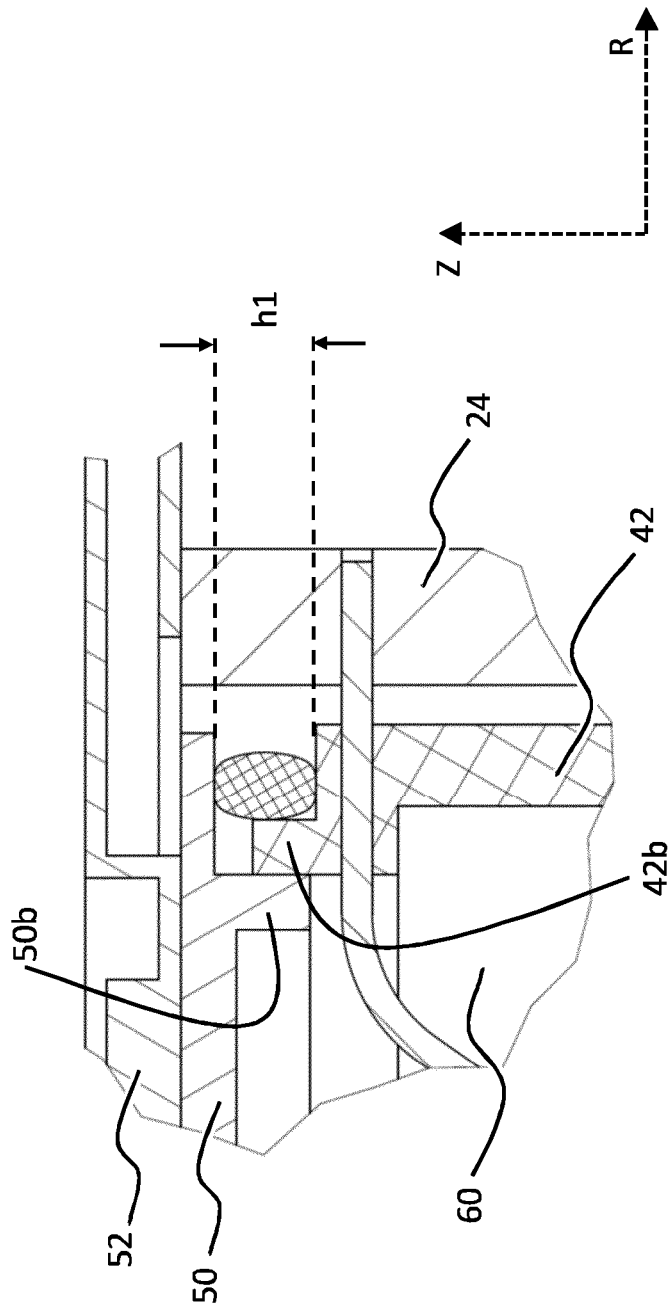

POWER SEMICONDUCTOR DEVICE

CROSS-REFERENCE TO RELATED APPLICATIONS

This application is a national stage application of International Application No. PCT/EP2020/071387, filed on Jul. 29, 2020, which claims priority to European Patent Application No. 19189286.8, filed on Jul. 31, 2019, which applications are hereby incorporated herein by reference.

TECHNICAL FIELD

The invention relates to power semiconductor device.

BACKGROUND

Press-pack power semiconductor devices may be used in high-power converter applications such as high-current rectifiers or medium-voltage drives. In these systems, fault situations may occur, in which a device loses its blocking capability and may be subject to an excessive fault current in the reverse direction. The local heating caused by this fault current may lead to electric arcing inside the device. The high temperature of the electric arc (about 20,000° C.) and the resulting pressure increase may cause damage to the hermetically sealed press-pack housings.

If the energy released in the electric arcing is sufficiently high, the are plasma may burn through the metal flanges of the housing, or may crack a ceramic insulating ring of the housing, which surrounds the device wafer. Fuses that are fast enough may be used to protect the power semiconductor device. Also, a housing design that will not rupture under the expected short-circuit current interval may provide further protection.

To prevent the impact of the are plasma on the flanges and on the ceramic ring and thereby improve the non-rupture capabilities of a press-pack power semiconductor device, a protective ring-shaped part made of polymer material may be arranged in the volume between the ceramic ring and the device wafer.

DE 103 06 767 A1 relates to a press-pack semiconductor device with a housing isolator, interposed between two electrodes. Inside the housing isolator, a further isolator surrounds a semiconductor element.

DE 89 09 244 U1 discloses a press-pack power semiconductor device having a ceramic ring as part of a housing. Inside the ceramic ring a Teflon band may be arranged.

DE 30 32 133 C2 discloses a press-pack power semiconductor device with a cylinder element of ceramic surrounding an explosion protection element of silicone, in which a semiconductor wafer is arranged.

EP 1 906 443 A2 discloses a pressure-contact semiconductor device which includes thermal buffer plates and main electrode blocks having flanges, by which a semiconductor substrate having a pair of electrodes is sandwiched, wherein the semiconductor substrate is sealed in a gas-tight space by joining the flanges to form an isolating container. The semiconductor device is configured such that the outermost periphery of the semiconductor substrate is enclosed by a hollow cylindrical insulator fitted on an outer periphery of the main electrode blocks in the gas-tight space with an O-ring fitted between each main electrode block and the cylindrical insulator, respectively, to seal the gas-tight space with reaction force from the O-rings.

U.S. Pat. No. 4,274,106 discloses a flat package semiconductor device. Two opposite electrodes are disposed at both ends of a hollow, electrically insulating cylinder to sandwich a semiconductor element between them and connected to those ends through thin metallic annuli respectively. The semiconductor element is physically isolated from each of the metallic annuli either by an annular member interposed between a circumferential protrusion of each electrode and the hollow cylinder or by contacting directly the protrusion with the cylinder. A pressure is applied through the electrodes to maintain the semiconductor element in compressive contact with those electrodes while subjecting an O-ring between each electrode and an end surface of the hollow, electrically insulating cylinder, respectively, to an elastic deformation.

In all of the known press-pack power semiconductor devices, the housing is configured to be used for a specific wafer diameter and for a specific wafer thickness. For different wafers having different wafer thicknesses and/or different wafer diameters, different housings have to be used which differ from each other by its geometric dimensions.

Moreover, flanges laterally protruding from the electrode blocks and connected to the outer insulating ring in the known press-pack power semiconductor devices must be relatively thick to ensure resistance to the are plasma in case of a device failure and to thereby ensure an explosion resistant housing.

SUMMARY

The invention relates to power semiconductor device and, in particular embodiments, to a press-pack power semiconductor device that may be stacked with other equally designed press-pack power semiconductor devices.

Embodiments of the invention can provide an improved power semiconductor device comprising a housing which is to be used for a variety of different wafer thicknesses.

In one embodiment, A power semiconductor device comprises a disc-shaped first electrode having a first contact face and a disc-shaped second electrode having a second contact face opposite to the first contact face, a wafer sandwiched between the first electrode and the second electrode, an outer insulating ring attached to the first electrode and to the second electrode, the outer insulating ring surrounding the wafer, an inner insulating ring inside of the outer insulating ring and surrounding the wafer, a ring-shaped first flange portion laterally surrounding a main portion of the first electrode, a radial first direction being parallel to the first contact face, and an O-ring radially surrounding the main portion of the first electrode and being sandwiched in a second direction perpendicular to the first contact face between the inner insulating ring and the first flange portion. The O-ring has in a relaxed state a cross-section being elongated in a vertical direction perpendicular to the radial direction, such that in a relaxed state, a height of the O-ring in the vertical direction is greater than a width of the O-ring in the radial direction, and wherein the O-ring is resiliently reversibly deformable

BRIEF DESCRIPTION OF THE DRAWINGS

Detailed embodiments of the invention will be explained below with reference to the accompanying figures, in which:

FIG. 5 shows a cross-section of a second electrode included in the power semiconductor device of FIG. 1;

FIG. 6a to 6c show respectively a portion of the vertical cross-section of FIG. 2 for different assembling heights;

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF ILLUSTRATIVE EMBODIMENTS

Figure 1:
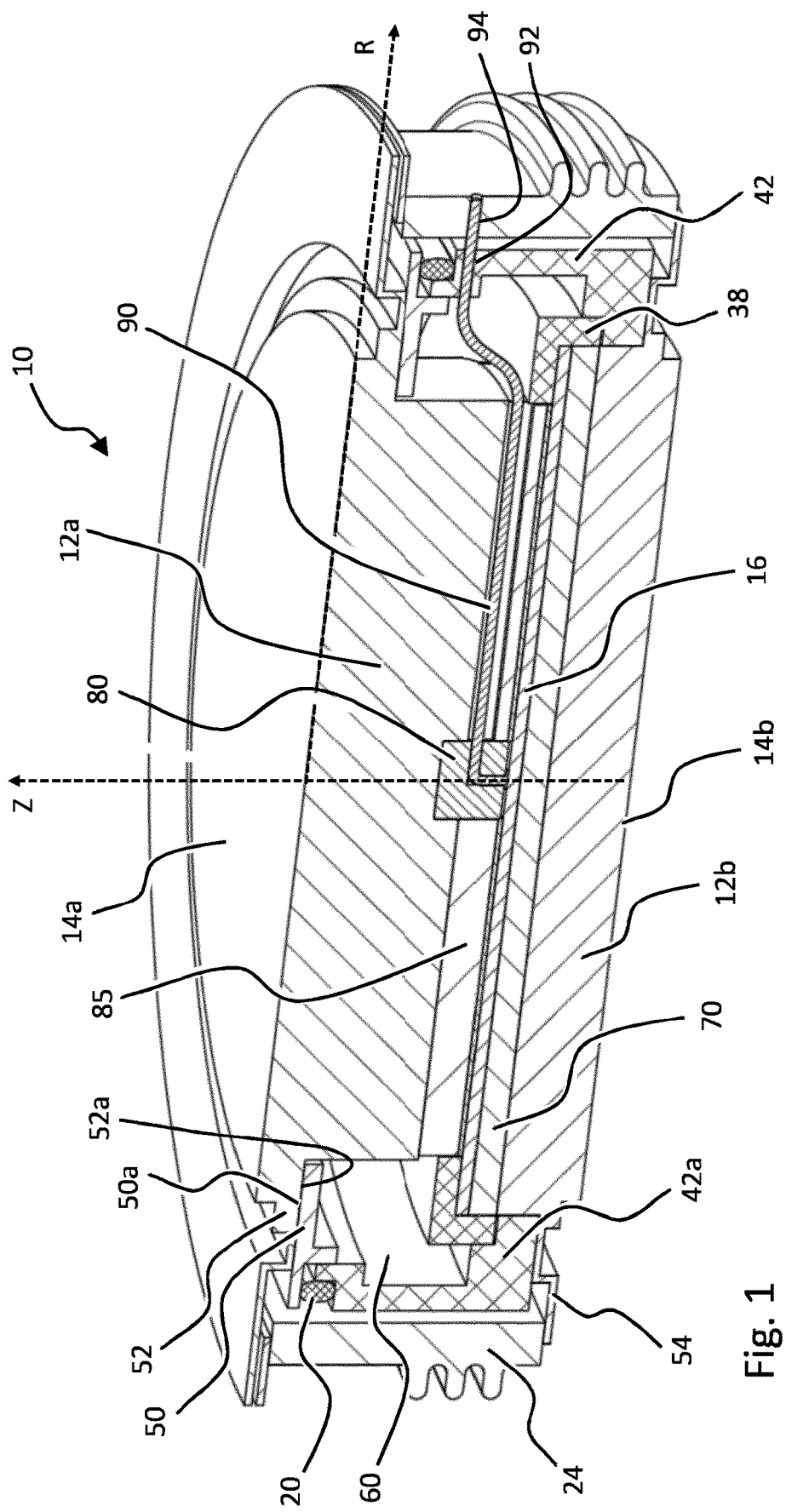
FIG. 1 shows a partial cross-sectional view of a power semiconductor device according to an embodiment.

A first embodiment power semiconductor device will first be described along with variations. Particular examples will then be provided with respect to the drawings.

In this embodiment, a power semiconductor device comprises a disc-shaped first electrode 12a having a first contact face 14a and a disc-shaped second electrode 12b having a second contact face 14b opposite to the first contact face 14a. A wafer 16 is sandwiched between the first electrode 12a and the second electrode 12b. An outer insulating ring 24 is attached to the first electrode 12a and to the second electrode 12b. The outer insulating ring 24 surrounds the wafer 16. An inner insulating ring 42; 42' is located inside of the outer insulating ring 24 and surrounds the wafer 16. A ring-shaped first flange portion 50 laterally surrounding a main portion 121a of the first electrode 12a, a radial first direction R being parallel to the first contact face 14a.

An O-ring 20 radially surrounds the main portion 121a of the first electrode 12a and is sandwiched in a second direction Z perpendicular to the first contact face 14a between the inner insulating ring 42; 42' and the first flange portion 50. In a relaxed state, the O-ring 20 has a cross-section that is elongated in a vertical direction Z perpendicular to the radial direction R such that in a relaxed state, a height of the O-ring in the vertical direction is greater than a width of the O-ring in the radial direction. The O-ring 20 is resiliently reversibly deformable.

For example, the O-ring has an oval shape in cross-section, wherein the oval cross-section is elongated in a direction perpendicular to the first contact face. Therein the cross-section is taken along a plane orthogonal to a main axis of the O-ring, i.e. along a plane orthogonal to the first contact face and parallel to the radial direction, which is parallel to the first contact face. The cross-section of the O-ring is formed, shaped and/or designed such that the O-ring is capable of providing a relatively high reactive force for different compression states of the O-ring. The O-ring is made out of an elastic and/or resilient material. The O-ring is elastic. The O-ring is resilient. The O-ring is reversibly deformable. The O-ring comprises a cross-section and is made out of a material such that the O-ring deforms when an external force is applied to the O-ring, in particular along the vertical direction. The O-ring returns to its original size and shape when that force is removed.

In various embodiments, the oval shape of the O-ring allows to provide a relatively high reactive force for a variety of different assembly heights when using the same housing for semiconductor wafers having different wafer thicknesses. That means that the oval shaped O-ring can provide a relatively high reactive force for different compression states of the O-ring.

In an exemplary embodiment, the inner insulating ring is made of a polymer material. Polymer material has properties that are especially appropriate for the inner insulating ring to protect the outer insulating ring in case of electrical arcing to prevent explosion of the housing.

In an exemplary embodiment, the outer insulating ring is made of ceramic material. Ceramic material has ideal electrically insulating properties.

In an exemplary embodiment, the first electrode and/or the second electrode are made from copper. Copper has a very high electrical conductivity and is therefore most appropriate as a material for the first and the second electrode.

In an exemplary embodiment, the first flange portion is made of steel. Steel can withstand high temperatures and is therefore especially resistant to the are plasma in case of arcing.

In an exemplary embodiment, the first electrode has a second flange portion radially extending from a main portion of the first electrode on a side of the first flange portion opposite to the O-ring. The second flange portion, which may be an integral part of the first electrode, facilitates to form a gas-tight housing.

In an exemplary embodiment, the second flange portion is made from copper. In such exemplary embodiment, a first flange portion made of steel might provide a most efficient protection of the second flange portion against are plasma in case of electrical arcing.

In an exemplary embodiment, in an orthogonal projection onto a plane parallel to the first contact face, the first flange portion overlaps the second flange portion in an area radially extending between the O-ring and the main portion of the first electrode. In such arrangement the second flange portion can be protected against are plasma most efficiently by the first flange portion in case of electrical arcing.

In an exemplary embodiment, the first flange portion has a first flat surface portion and the second flange portion has a second flat surface portion which is parallel to the first flat surface portion and which is pressed onto the first flat surface portion, wherein, in an orthogonal projection onto a plane parallel to the first contact face, the first flat surface portion and the second flat surface portion extend in an area between the O-ring and the first electrode. The first flat surface portion being pressed against the second flat surface portion allows to minimize the gap between the first flange portion and the second flange portion so that the first flange portion can protect the second flange portion most efficiently against arc-plasma in case of electrical arcing.

In an exemplary embodiment, a polymer foil is sandwiched between the first flat surface portion and the second flat surface portion. The polymer foil in this exemplary embodiment provides an efficient sealing so that the are plasma cannot enter in a gap between the first and the second flange portion.

In an exemplary embodiment, a first portion of the first flange portion is fully overlapped with a second portion of the inner insulating ring in a view along the radial direction, wherein the O-ring is arranged radially outside of the first portion and of the second portion. The overlapping first and second portion can effectively shield the O-ring from any arc-plasma in case of electrical arcing.

In an exemplary embodiment, the power semiconductor device comprises an exchangeable copper insert between the first electrode and the wafer. The exchangeable copper insert allows to use the same housing parts for different wafer diameters. In such case, only the exchangeable copper insert has to be adapted to the corresponding wafer diameter, whereas the remaining housing parts can be used for a variety of different wafer diameters. Throughout this specification, an element being exchangeable means that this element is a separate part, i.e., not integral with other parts of the power semiconductor device (but may be connected detachably to other parts).

In an exemplary embodiment, the inner insulating ring has a first end and a second end in the direction perpendicular to the radial direction, wherein the O-ring is arranged on the first end and wherein the second end has a radially protruding bottom portion extending radially inwards to the second electrode. In such exemplary embodiment the bottom portion of the inner insulating ring can efficiently shield any part of the housing provided below the bottom portion against arc-plasma in case of electrical arcing. In this exemplary embodiment a rubber protection ring may be attached to and surround the wafer radially inside of the inner insulating ring, wherein the bottom portion may contact the rubber protection ring. The direct contact between the bottom portion and the rubber protection ring can efficiently seal a space above the bottom portion.

In an exemplary embodiment, a space is defined by the inner insulating ring, the first electrode, the rubber protection ring and the first flange portion. Such space provides space for the arc-plasma in case of a device failure to thereby reduce the risk of an explosion because the space can relieve the pressure increase in case of electrical arcing.

Figure 2:
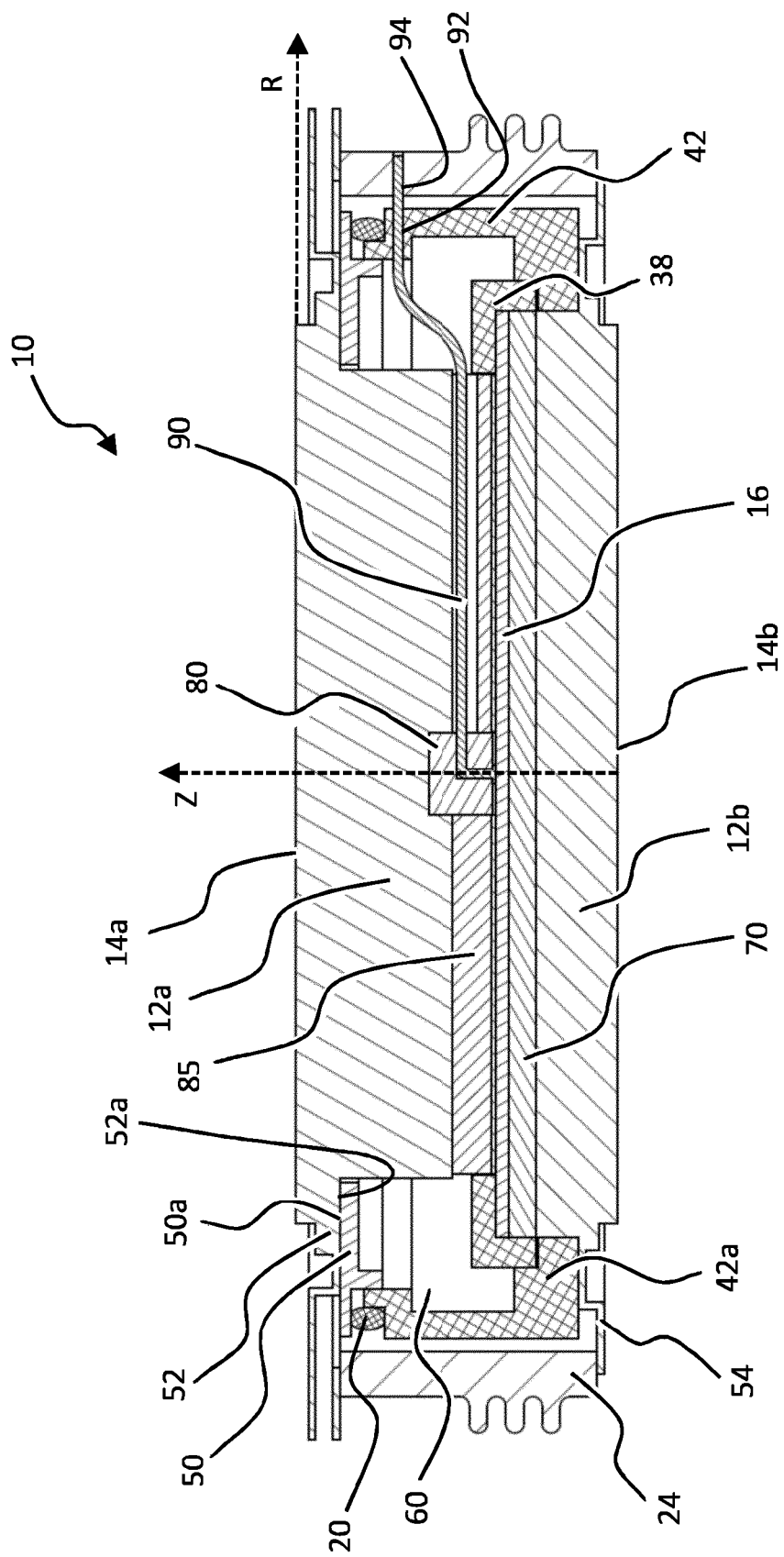
FIG. 2 shows a vertical cross-section of the power semiconductor device of FIG. 1.

Referring now to the figures, FIG. 1 shows a partial cross-sectional view of a power semiconductor device 10 according to an embodiment of the invention, and FIG. 2 shows a vertical cross-section of the power semiconductor device 10 shown in FIG. 1. The power semiconductor device 10 comprises a disc-shaped first electrode 12a, a disc-shaped second electrode 12b, a wafer 16 sandwiched between the first electrode 12a and the second electrode 12b, an outer insulating ring 24, an inner insulating ring 42, a ring-shaped first flange portion 50, and an O-ring 20.

In addition, a molybdenum layer 70 may be arranged between the wafer 16 and the second electrode 12b as a thermal buffer layer. The wafer 16 may be bonded to the molybdenum layer 70, for example by a low temperature bonding process (LTB). Alternatively, the first molybdenum 70 may be free-floating without being bonded to the wafer 16.

The wafer 16 may be a silicon wafer, for example. A switch such as a thyristor, a transistor or a power diode may be implemented in the wafer 16.

The first electrode 12a has a first contact face 14a and the second electrode 12b has a second contact face 14b opposite to the first contact face 14a. Therein, the first contact face 14a and the second contact face 14b are both flat and parallel to each other. Exemplarily, the first contact face 14a and the second contact face 14b may have a circular shape as shown in FIG. 1. When the power semiconductor device 10 is stacked with other equally designed press-pack power semiconductor devices 10 in a stack, the first electrode 12a and the second electrode 12b may act as contact pole pieces.

The outer insulating ring 24 has the form of a hollow cylinder and may further comprise a fin structure as shown in FIGS. 1 and 2 to ensure the necessary clearance and/or creepage distances between the first electrode 12a and the second electrode 12b. As shown in FIG. 2, the outer insulating ring 24 has an upper first end and a lower second end. Throughout the specification, an upper side of the power semiconductor device 10 is a side of the power semiconductor device 10 where the first contact face 14a is arranged and a lower side of the power semiconductor device 10 is a side of the power semiconductor device 10 where the second contact face 14b is arranged. It is attached with its first end to the first electrode 12a and with its second end to the second electrode 12b. The inner insulating ring 42 is laterally arranged inside of the outer insulating ring 24, i.e. the outer insulating ring 24 radially surrounds the inner insulating ring 42, wherein a radial direction R is a direction that is parallel to the first contact face 14a and that extends away from a lateral center of the first contact face 14a. Both, the outer insulating ring 24 and the inner insulating ring 42 are arranged to radially surround the wafer 16. The outer insulating ring 24 forms a side wall of a hermetically sealed housing of the power semiconductor device 10.

Figure 3:
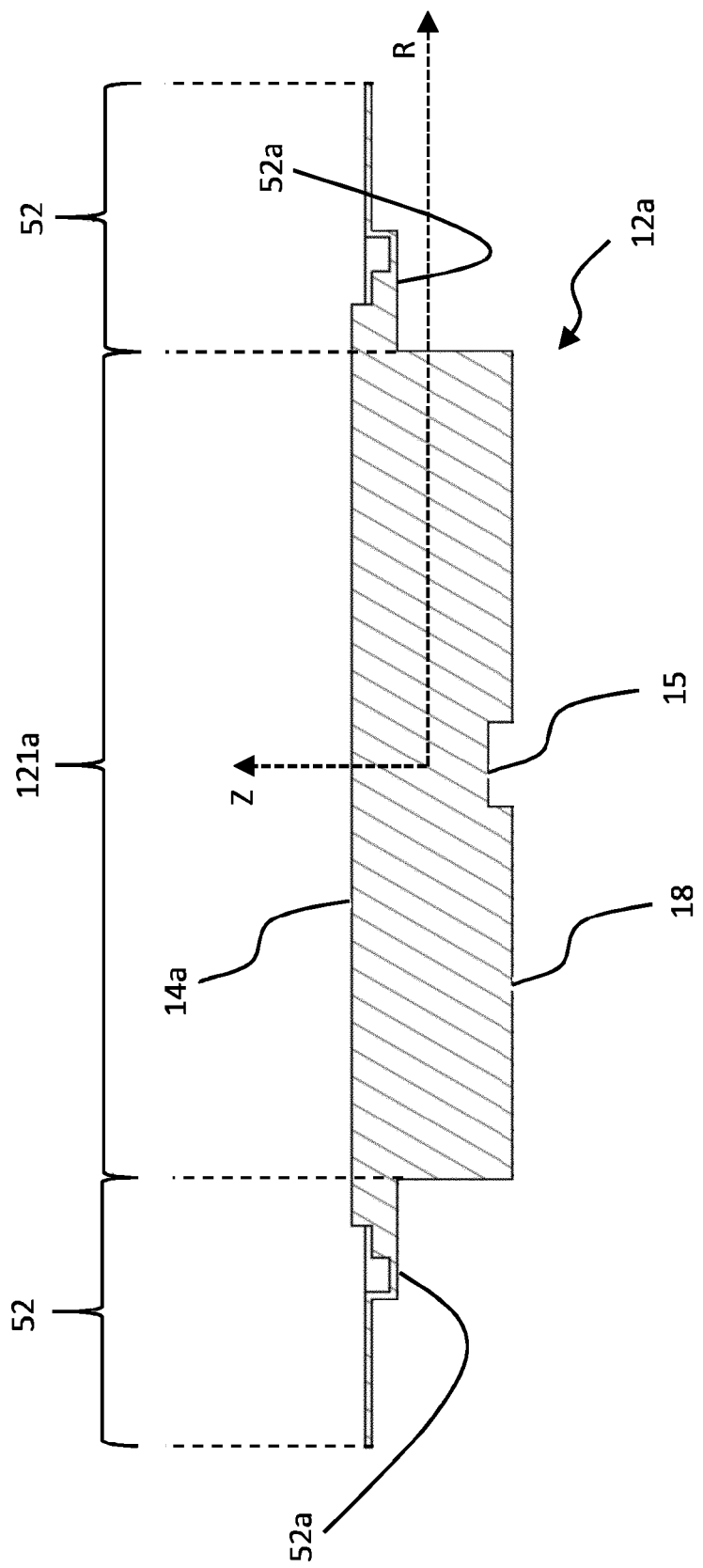
FIG. 3 shows a vertical cross-section of a first electrode included in the power semiconductor device of FIG. 1.

FIG. 3 shows a vertical cross-section of the first electrode 12a. As indicated in FIG. 3, the first electrode 12a has a main portion 121a and a second flange portion 52 radially extending from an upper end of the main portion 121a. The upper end of the first electrode 12a is that end of the first electrode 12a which is in the vertical direction Z at a side where the first contact face 14a is arranged. On its lower side 18 the first electrode 12a has a recess 15 for receiving a later described spring element 80. As can be seen from FIGS. 1 to 3, the first flange portion 50 radially surrounds the main portion 121a of the first electrode 12a.

Figure 4:
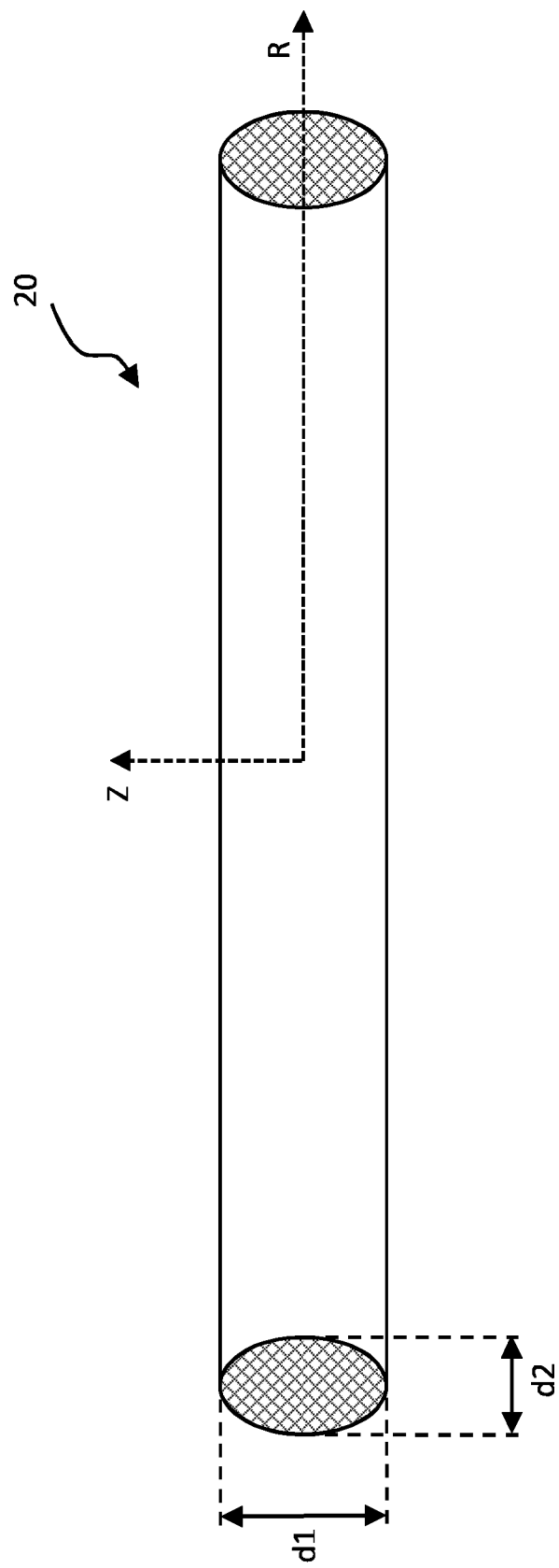
FIG. 4 shows a vertical cross-section of an O-ring included in the power semiconductor device of FIG. 1.

In the power semiconductor device 10 as shown in FIGS. 1 and 2, the O-ring 20 radially surrounding the main portion 121a of the first electrode 12a is sandwiched between an upper end of the inner insulating ring 42 and a lower side of the first flange portion 50. FIG. 4 shows a vertical cross-section of the O-ring 20 in a relaxed state, i.e. when no pressure is applied to the O-ring 20 by the inner insulating ring 42 and the first flange portion 50. In the relaxed state, the O-ring 20 has a cross-section along a plane parallel to the radial direction R and a vertical direction Z perpendicular to the first contact face 14a, which plane is the drawing plane of FIG. 4.

The cross-section shown in FIG. 4 is orthogonal to a main axis of the O-ring 20. Therein, the cross-section is elongated in the vertical direction Z perpendicular to the radial direction R. Along the vertical direction Z, the O-ring 20 has a first width d1 and along the radial direction R the O-ring 20 has a second width d2, which is smaller than the first width d1. Exemplarily, the first width d1 is the largest width of the O-ring 20 in the vertical cross-section and the second width d2 is the smallest width of the O-ring 20 in the vertical cross-section. Exemplarily, the O-ring 20 has a cross-section shape that is oval, as shown in the figures. Exemplarily, the O-ring 20 is made of silicone material. The silicone material has good elastic properties and has a sufficient heat resistance to withstand the thermal load during operation of the power semiconductor device. Exemplarily, the O-ring 20 is made of another resiliently and/or reversibly deformable material.

The inner insulating ring 42 may be made of a polymer material which has good electrical insulating properties. The outer insulating ring 24 may be made of a ceramic material. The inner insulating ring 42 can efficiently shield the outer insulating ring 24 against the arc plasma in case of electrical arcing and prevent explosion of the housing of the power semiconductor device 10 in case of a device failure and electrical arcing.

In the power semiconductor device 10 shown in FIGS. 1 and 2, the second flange portion 52 is arranged and radially extends on a side of the first flange portion 50 opposite to the O-ring 20. The first electrode 12a and the second electrode 12b is made from a material having high electrical conductivity such as copper. In particular the second flange portion 52 may be made from copper which is a relatively soft material that may easily be damaged when getting into contact with an arc plasma in case of electrical arcing due to a device failure.

The first flange portion 50 is made of a material that can withstand high temperatures of an arc plasma in case of electrical arcing. Exemplarily it may be made of steel. In an orthogonal projection onto a plane parallel to the first contact face 14a, the first flange portion 50 overlaps the second flange portion 52 in an area radially extending between the O-ring 20 and the main portion 121a of the first electrode 12a. The first flange portion 50 has a first flat surface portion 50a and the second flange portion 52 has a second flat surface portion 52a which is parallel to the first flat surface portion 50a and which is pressed onto the first flat surface portion 50a, wherein in an orthogonal projection onto a plane parallel to the first contact face 14a, the first flat surface portion 50a and the second flat surface portion 52a extend in an area between the O-ring 20 and the first electrode 12a.

Figure 7:
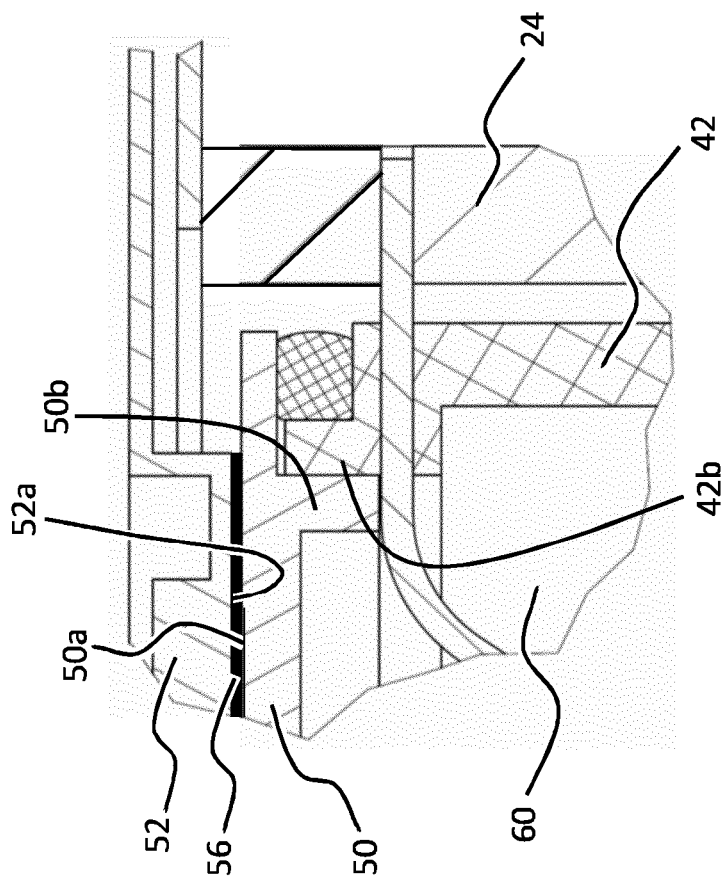
FIG. 7 shows a vertical cross-section of a first modified embodiment of the power semiconductor of FIG. 1.

In the exemplary embodiment shown in FIG. 1, the first flat surface portion 50a is shown to be in direct contact with the second flat surface portion 52a. In an first modified embodiment as shown in FIG. 7, a polymer foil 56 may be sandwiched between the first flat surface portion 50a and the second flat surface portion 52a to provide an additional sealing effect. The polymer foil 56 may be a Polytetrafluoroethylene (PTFE) foil. It may exemplarily have a thickness in a range between 50 μm and 500 μm. Besides the additional feature of the polymer foil 56 the first modified embodiment may be identical to the embodiment illustrated in FIGS. 1 and 2.

As can be seen in FIGS. 1 and 2 a first portion 50b of the first flange portion 50 is fully overlapped with a second portion 42b of the inner insulating ring 42 in a view along the radial direction R. The O-ring 20 is arranged radially outside of the first portion 50b and of the second portion. With the radial overlap of the first portion 50b and the second portion 42b the O-ring 20 is shielded against an arc plasma generated in the power semiconductor device 10 in case of electrical arcing due to a device failure.

The inner insulating ring 42 has a first end and a second end in the vertical direction Z perpendicular to the radial direction R, wherein the O-ring 20 is arranged on the first end. The second end has a radially protruding bottom portion 42a extending radially inwards to the second electrode 12b. A rubber protection ring 38 is attached to and surrounds the wafer 16 radially inside of the inner insulating ring 42. The bottom portion 42a contacts the rubber protection ring 38 so that a space 60 is defined by the inner insulating ring 42, the first electrode 12a, the rubber protection ring 38 and the first flange portion 50. The space may exemplarily be filled with a protection gas such as nitrogen or helium. In case of electrical arcing due to a device failure a pressure increase in the housing of the power semiconductor device 10 can be kept at a relatively low level and thereby explosion of the housing can be prevented by providing the space 60.

The power semiconductor device 10 comprises an exchangeable copper insert 85 between the first electrode 12a and the wafer 16. With such exchangeable copper insert 85 the electrical contact area between first electrode 12a and a main contact on the wafer 16 can be adjusted for different wafer diameters. Accordingly, it is possible to use the same housing (including the first electrode 12a, the second electrode 12b, the outer insulating ring 24, the first flange portion 50 and the inner insulating ring 42) also for various chip diameters by respectively using different sized copper inserts.

In the exemplary embodiment shown in FIG. 1, a gate lead 90 is guided through a first radial opening 92 in the inner insulating ring 42 and through a second radial opening 94 in the outer insulating ring 24. The gate lead 90 is further guided through a channel in the copper insert 85 or in the first electrode 12a or between the copper insert 85 and the first electrode 12a to a control terminal at the lateral center of the wafer 16. The copper insert 85 has an opening which is aligned with the above mentioned recess 15 in the first gate electrode 12a for receiving a spring element 80 used for pressing the gate lead 90 or a gate contact connected to the gate lead 90 onto the control terminal of the wafer 16.

FIG. 5 shows a vertical cross-section of the second electrode 12b included in the power semiconductor device of FIG. 1. It comprises a main portion 121b and a third flange portion 54 which is radially extending from a lower side of the main portion 121b. The lower side of the main portion 121b forms the second contact face 14b and an upper side 17 of the main portion 121b is electrically connected to the molybdenum layer 70. The second electrode 12b is attached to the outer insulating ring 24 with the third flange portion 54.

Figure 6B:
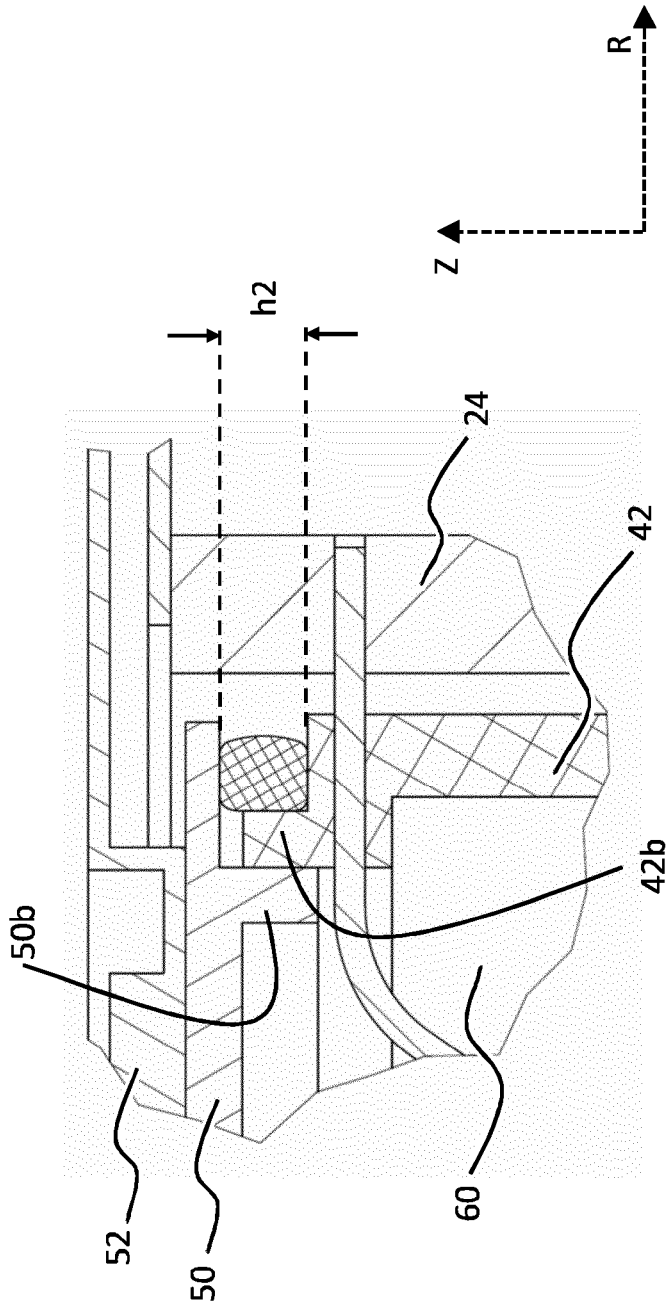
Figure 6C:
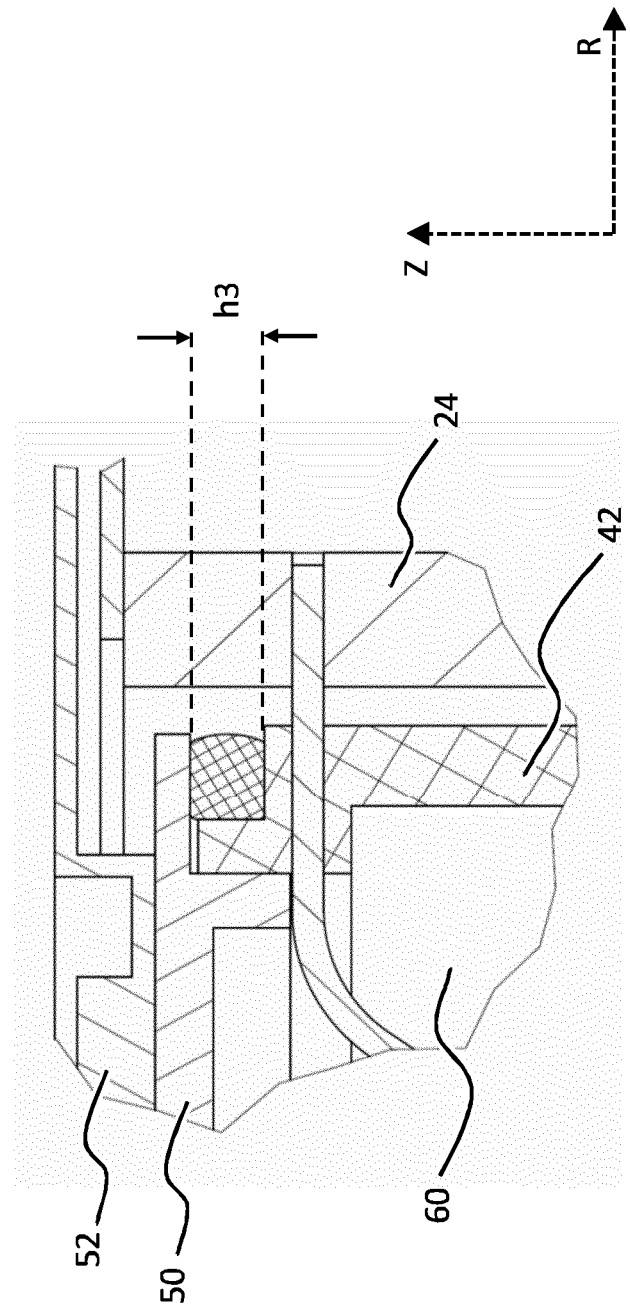

FIGS. 6a to 6c show respectively a portion of the vertical cross-section of FIG. 2 for different assembling heights due to different wafer thicknesses. The different assembling heights result in different compression states of the O-ring 20. In FIG. 6a the O-ring 20 is vertically compressed to a vertical width h1 (relatively low compression state), in FIG. 6b the O-ring 20 is compressed to a vertical width h2<h1 (medium compressed state), and in FIG. 6c the O-ring is compressed to a vertical width h3<h2 (strongly compressed state). Due to the cross-section of the O-ring 20 which is elongated in the vertical direction, such as the oval shape of the vertical cross-section of the O-ring 20 exemplarily shown in the figures, the reactive force of the O-ring 20 is relatively high for all three different compression states and a good sealing effect between the first flange portion 50 and the inner insulating ring 42 can be achieved for different assembling heights due to different wafer thicknesses.

It will be appreciated by those skilled in the art that the present invention can be embodied in other specific forms without departing from the scope of the invention as defined by the appended claims.

Figure 8:
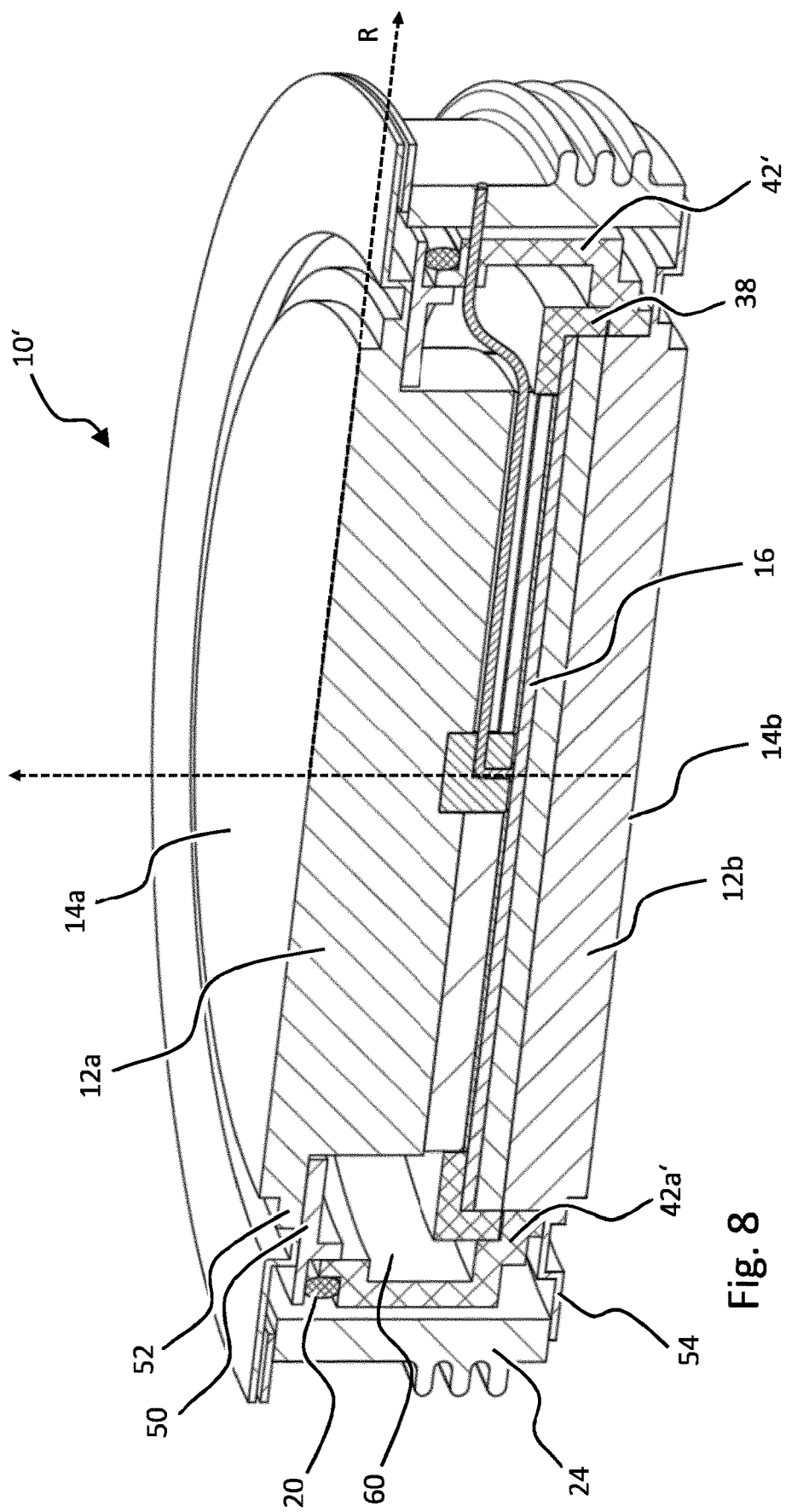
FIG. 8 shows a partial cross-sectional view of a second modified embodiment of the power semiconductor device.

For example, FIG. 8 shows a partial cross-sectional view of a power semiconductor device 10' which is a second modified embodiment of the power semiconductor device 10. The power semiconductor device 10' differs from the power semiconductor device 10 of FIG. 1 only in that the bottom portion 42a' of an inner insulating ring 42' extending radially inwards to the second electrode 12b has a different shape than the bottom portion of inner insulating ring 42. Specifically, the bottom portion 42' has a step-like shape in a vertical cross-section.

In the embodiment as shown in FIG. 1, the rubber protection ring 38 covers only a side surface and part of a top surface of the wafer 16. However, the rubber protection ring 38 may also cover other parts of a wafer surface, e.g. a lower side of the wafer 16 or only part of the side surface.

In the above embodiments, the wafer 16 is described with a control terminal that is connected to the outside via a gate lead 90. However, the wafer 16 may have no control terminal and no gate lead 90 may be provided. Accordingly, the outer insulating ring 24 may have no first radial opening 92 and the inner insulating ring 42 may have no second radial opening 94.

A second molybdenum layer may be arranged as a thermal buffer layer between the wafer 16 and the first electrode 12a.

The power semiconductor device 10 was described with the exchangeable copper insert 85 arranged between the wafer 16 and the first electrode 12a. However, in another exemplary embodiment no copper insert 85 may be interposed between the first electrode 12a and the wafer 16.

It should be noted that the term "comprising" does not exclude other elements or steps and that the indefinite article "a" or "an" does not exclude the plural. Also elements described in association with different embodiments may be combined.

The invention claimed is:

1. A power semiconductor device comprising:
 a disc-shaped first electrode having a first contact face;
 a disc-shaped second electrode having a second contact face opposite to the first contact face;
 a wafer sandwiched between the first electrode and the second electrode;
 an outer insulating ring attached to the first electrode and to the second electrode, the outer insulating ring surrounding the wafer;
 an inner insulating ring inside of the outer insulating ring and surrounding the wafer;
 a ring-shaped first flange portion laterally surrounding a main portion of the first electrode; and
 an O-ring radially surrounding the main portion of the first electrode and being sandwiched in a vertical direction perpendicular to the first contact face between the inner insulating ring and the first flange portion, wherein the O-ring is resiliently reversibly deformable and wherein in a relaxed state the O-ring has a cross-section that is elongated in the vertical direction such that, in the relaxed state, a height of the O-ring in the vertical direction is greater than a width of the O-ring in a radial direction that is parallel to the first contact face.

2. The power semiconductor device of claim 1, wherein the inner insulating ring comprises polymer material.

3. The power semiconductor device of claim 1, wherein the outer insulating ring comprises ceramic material.

4. The power semiconductor device of claim 1, wherein the first electrode or the second electrode are made from copper.

5. The power semiconductor device of claim 1, wherein the first flange portion comprises steel.

6. The power semiconductor device of claim 1, wherein a first portion of the first flange portion is fully overlapped with a second portion of the inner insulating ring in a view along the radial direction and wherein the O-ring is arranged radially outside of the first portion and of the second portion.

7. The power semiconductor device of claim 1, further comprising an exchangeable copper insert arranged between the first electrode and the wafer.

8. The power semiconductor device of claim 1, wherein the inner insulating ring has a first end and a second end in the vertical direction, wherein the O-ring is arranged on the first end and wherein the second end has a radially protruding bottom portion extending radially inwards to the second electrode.

9. The power semiconductor device of claim 8, further comprising a rubber protection ring attached to the wafer surrounding the wafer radially inside of the inner insulating ring, wherein the bottom portion contacts the rubber protection ring.

10. The power semiconductor device of claim 9, wherein a space is defined by the inner insulating ring, the first electrode, the rubber protection ring and the first flange portion.

11. The power semiconductor device of claim 1, wherein the cross-section of the O-ring has an oval shape.

12. A power semiconductor device comprising:
 a disc-shaped first electrode having a first contact face;
 a disc-shaped second electrode having a second contact face opposite to the first contact face;
 a wafer sandwiched between the first electrode and the second electrode;
 an outer insulating ring attached to the first electrode and to the second electrode, the outer insulating ring surrounding the wafer;
 an inner insulating ring inside of the outer insulating ring and surrounding the wafer;
 a ring-shaped first flange portion laterally surrounding a main portion of the first electrode; and
 an O-ring radially surrounding the main portion of the first electrode and being sandwiched in a vertical direction perpendicular to the first contact face between the inner insulating ring and the first flange portion;
 wherein the first electrode has a second flange portion radially extending from the main portion of the first electrode on a side of the first flange portion opposite to the O-ring; and
 wherein the O-ring is resiliently reversibly deformable and wherein in a relaxed state the O-ring has a cross-section that is elongated in the vertical direction such that, in the relaxed state, a height of the O-ring in the vertical direction is greater than a width of the O-ring in a radial direction that is parallel to the first contact face.

13. The power semiconductor device of claim 12, wherein the second flange portion comprises copper.

14. The power semiconductor device of claim 12, wherein in an orthogonal projection onto a plane parallel to the first contact face, the first flange portion overlaps the second flange portion in an area radially extending between the O-ring and the main portion of the first electrode.

15. The power semiconductor device of claim 12, wherein the first flange portion has a first flat surface portion and the second flange portion has a second flat surface portion that is parallel to the first flat surface portion and that is pressed onto the first flat surface portion.

16. The power semiconductor device of claim 15, wherein in an orthogonal projection onto a plane parallel to the first contact face, the first flat surface portion and the second flat surface portion extend in an area between the O-ring and the main portion of the first electrode.

17. The power semiconductor device of claim 15, further comprising a polymer foil sandwiched between the first flat surface portion and the second flat surface portion.

18. A power semiconductor device comprising:
 a first copper electrode having a first contact face and being disc-shaped;
 a second copper electrode having a second contact face and being disc-shaped, the second contact face being opposite to the first contact face;
 a wafer sandwiched between the first electrode and the second electrode;

a ceramic outer insulating ring attached to the first electrode and to the second electrode, the outer insulating ring surrounding the wafer;

a polymer inner insulating ring inside of the outer insulating ring and surrounding the wafer, the inner insulating ring comprising polymer material;

a ring-shaped first flange portion laterally surrounding a main portion of the first electrode; and an O-ring radially surrounding the main portion of the first electrode and being sandwiched in a vertical direction perpendicular to the first contact face between the inner insulating ring and the first flange portion, wherein the O-ring is resiliently reversibly deformable and wherein in a relaxed state the O-ring has a cross-section that is elongated in the vertical direction such that, in the relaxed state, a height of the O-ring in the vertical direction is greater than a width of the O-ring in a radial direction that is parallel to the first contact face.

19. The power semiconductor device of claim 18, wherein a first portion of the first flange portion is fully overlapped with a second portion of the inner insulating ring in a view along the radial direction and wherein the O-ring is arranged radially outside of the first portion and of the second portion.

20. The power semiconductor device of claim 18, wherein the inner insulating ring has a first end and a second end in the vertical direction, wherein the O-ring is arranged on the first end and wherein the second end has a radially protruding bottom portion extending radially inwards to the second electrode.

* * * * *